United States Patent [19]
Nguyen et al.

[11] Patent Number: 5,462,812
[45] Date of Patent: Oct. 31, 1995

[54] FLUORINATED SILICON NITRIDE FILMS

[76] Inventors: Son V. Nguyen, 7 Clove Ct.; David M. Dobuzinsky, 29 Shenandoah Rd., both of Hopewell Junction, N.Y. 12533; Douglas J. Dopp, 38D Winthrop Ct., Wappingers Falls, N.Y. 12590; David L. Harmon, 72 Logwood Cir., Essex Junction, Vt. 05451

[21] Appl. No.: 998,194

[22] Filed: Dec. 29, 1992

Related U.S. Application Data

[62] Division of Ser. No. 814,973, Dec. 24, 1991, Pat. No. 5,204,138.

[51] Int. Cl.$^6$ .................................................. H01L 21/318
[52] U.S. Cl. .......................... 428/696; 428/698; 428/702; 106/287.11
[58] Field of Search ........................... 428/698, 697, 428/696, 702; 427/255.2, 255.1; 106/287.11

[56] References Cited

U.S. PATENT DOCUMENTS

| | | | |
|---|---|---|---|
| 3,485,666 | 12/1965 | Sterling et al. | 117/230 |
| 4,504,518 | 3/1985 | Ovshinsky et al. | 427/38 |
| 4,668,365 | 5/1987 | Foster et al. | 204/192.23 |
| 4,704,300 | 11/1987 | Yamazaki | 427/38 |
| 4,720,395 | 1/1988 | Foster | 437/241 |
| 4,759,947 | 7/1988 | Ishihara et al. | 427/38 |
| 4,786,612 | 11/1988 | Yau et al. | 437/47 |
| 4,877,641 | 10/1989 | Dory | 427/38 |
| 5,045,346 | 9/1991 | Tabasky et al. | 427/39 |

FOREIGN PATENT DOCUMENTS 277766  3/1988  European Pat. Off. ...... H01L 21/318

OTHER PUBLICATIONS

"Low Temperature Silicon Nitride Deposition Using Microwave–Excited Active Nitrogen," by Shibagaki et al.; Japanese Journal of Applied Physics, vol. 17, Supplement 17–1, (1978), pp. 215–221.

*Primary Examiner*—A. A. Turner

[57] ABSTRACT

A plasma enhanced chemical vapor deposition process for producing a fluorinated silicon nitride film on a substrate is disclosed. The process utilizes a mixture of silane, perfluorosilane and nitrogen to produce films of high conformality and stability. The silane and perfluorosilane in the mixture are in a ratio of 0.05 to 1 on a volume basis. The preferred silane is $SiH_4$ and the preferred perfluorosilane is $SiF_4$. Films prepared by the process are disclosed and their properties are described.

6 Claims, 3 Drawing Sheets

FLUORINATED SILICON NITRIDE FILMS

CROSS-REFERENCE TO RELATED APPLICATION

This is a divisional of our prior copending U.S. application Ser. No. 07/814973, filed Dec. 24, 1991, now U.S. Pat. No. 5,204,138.

TECHNICAL FIELD

This invention relates to a plasma enhanced chemical vapor deposition (PECVD) process for producing a fluorinated silicon nitride film on a substrate and to a film so produced. The process utilizes a mixture of silane, perfluorosilane, and nitrogen to produce films of high conformality and stability.

BACKGROUND ART

The trend toward ever greater device densities, smaller minimum feature sizes, and smaller separations in integrated circuits imposes increasingly stringent requirements on the basic fabrication steps of masking, film formation (by deposition or growth), doping and etching. Ultra large scale integrating (ULSI) devices require the fabrication of circuits on the nanometer (nm) scale. For certain applications in such circuits, silicon nitride films offer advantages over silicon oxide films. For example, as a collar material for storage trenches, a film of silicon nitride 30 nm thick can provide comparable dielectric properties to a 100 nm silicon dioxide film. In addition, because stable fluorinated silicon nitride is not permeable to oxygen, the surface of the substrate (usually silicon) is protected from oxidation. Silicon nitride films that are stable and conformal would be particularly useful for low temperature side wall spacers for sub-micron gates, for high temperature annealing caps for GaAs dopant activation and for interlevel dielectric materials.

However, the advantages of a silicon nitride film can only be realized if a thin film can be made by a process that is compatible with the technology for manufacturing ULSI devices. The process must avoid high temperatures and incompatible chemistry. Chemical vapor deposition processes for producing silicon nitride films are known.

U.S. Pat. No. 4,668,365 (Foster et al.) discloses a plasma CVD reactor and an associated process using a magnetic field to provide silicon nitride films. This process uses silane as a source of silicon and molecular nitrogen as the source of nitrogen.

U.S. Pat. No. 3,485,666 (Sterling et al.) discloses a method of directly depositing an electrically insulating, amorphous, coherent, solid layer of silicon nitride produced from silane and ammonia.

U. S. Pat. No. 4,786,612 (Yau et al.) discloses a plasma enhanced CVD process for fabricating a silicon nitride resistor in a semiconductor device. The process uses a mixture of silane, nitrogen and ammonia.

U. S. Pat. No. 4,504,518 (Ovshinsky et al.) discloses a plasma enhanced CVD process for producing a silicon nitride film which uses microwave radiation to generate the plasma. Mixtures of silane and nitrogen or ammonia are disclosed as reaction gases and mixtures of silicon tetrafluoride and nitrogen or ammonia are also disclosed.

Shibagaki et al. [*Japanese Journal of Applied Physics*, 17, suppl 17, 215–221 (1978)] discloses the deposition of the silicon nitride film by the reaction of silane with molecular nitrogen using microwave energy to generate the plasma.

Silicon nitride films of the foregoing art have been limited in their utility by the presence of silicon hydrogen bonds in the silicon nitride film. Some of the silicon hydrogen bonds are relatively weak and tend to dissociate with subsequent migration of hydrogen through the silicon nitride material. In many of the films of the art the concentration of hydrogen in the deposited silicon nitride can be as high as 25–35 atom percent. The presence of hydrogen in films that are deposited relatively early in the integrated circuit fabrication process, and the hydrogen diffusion which results during subsequent fabrication, can cause non-uniform electrical characteristics and adhesion problems at interfaces of the film.

There has thus been a strong incentive to produce silicon nitride having a low hydrogen content or having strongly bonded hydrogen that is not mobile. However, the removal of hydrogen by annealing appears to have led to chemical instability such that the film exhibits film stress and poor adhesion. The drawback of this approach to lowered hydrogen has led to a search for plasma processes which employ gases that reduce or stabilize hydrogen in the silicon nitride. The incorporation of fluorine into the silicon nitride film obviates a number of these problems. Although a precise explanation for the combination of fluorine, hydrogen, nitrogen and silicon into silicon nitride layers is not available, it is believed that fluorine present in the plasma preferentially bonds with silicon in the silicon nitride material either preventing formation of silicon-hydrogen bonds or replacing such bonds with silicon-fluorine bonds. It would seem that providing an abundance of fluorine atoms would solve the problem. However the presence of excess fluorine in the plasma results in the creation of nitrogen-fluorine bonds and $SiF_2$ linkages. The presence of nitrogen-fluorine bonds is not desirable because they lead to a substantial chemical degradation in the resulting silicon nitride film. Similarly $SiF_2$ linkages are extremely sensitive to degradation by moisture. Clearly an appropriate ratio of silicon and nitrogen to fluorine is required to produce the desired stoichiometry.

U.S. Pat. No. 4,720,395 (Foster) discloses a thermal CVD process for forming a silicon nitride film. Disilane and $NF_3$ in a mole ratio of 0.5–3.0 are employed as the sources of silicon, nitrogen, and fluorine. The films are characterized only by their refractive indices.

U.S. Pat. No. 4,704,300 (Yamazaki) discloses a plasma CVD process for forming a fluorinated silicon nitride film. Silicon fluoride is fed into the reactor in the form of $SiF_4$ and converted in situ to a mixture of $SiF_4$ and $SiF_2$ which then reacts with nitrogen, ammonia or nitrogen fluoride to provide the silicon nitride film. The process does not employ silane as a reactant. The films are stated to have a surface density of $3\times10^{11}$ charges/$cm^2$ or less.

European Application 277,766 (Chang et al.) discloses a plasma CVD process for forming a silicon nitride film. The examples employ mixtures of silane, $NF_3$, and nitrogen. The generic description indicates that hydrazine or ammonia maybe used in place of $NF_3$ and $SiH_4$ may be replaced by $Si_2H_4$ or chlorinated or partially fluorinated silanes. The films are stated to have breakdown voltages of 4 MV/cm and dielectric constants of 4 to 5.

The foregoing references disclose methods for producing fluorinated silicon nitride films, but all have drawbacks. The use of $NH_3$, as suggested by Chang and by Yamazaki, leads to films having lower long-term chemical stability than films made from $N_2$. The use of $NF_3$, as suggested by Chang and by Foster, leads to etching of the substrate during the initial deposition step, which is usually undesirable. Moreover, the production of silicon-fluorine bonds using $NF_3$ as the source of fluorine requires a multi-step dissociation and recombination reaction which is inherently less attractive than starting with silicon-fluorine bonds. The use of hydrogen fluoride as suggested by Chang is difficult to control; both $NF_3$ and HF are highly corrosive materials.

There thus exists a need for an easily controlled, predictable CVD process for producing fluorinated silicon nitride films that are stable, conformal and compatible with other steps in the fabrication of integrated circuits.

The term silicon nitride as used herein means a composition of approximate stoichiometry $Si_3N_4$ and fluorinated silicon nitride describes compositions of empirical formulae $Si_3N_xF_yH_z$ where x is from 3 to 4, y is from 0.01 to 1.15 and z is from 0.7 to 5. The generic term silane includes $SiH_4$, $Si_2H_6$, $Si_3H_8$ and other silanes of empirical formula $Si_nH_{(2n+2)}$. The generic term perfluorosilane includes $SiF_4$, $Si_2F_6$, $Si_3F_8$ and other perfluorosilanes of empirical formula $Si_nF_{(2n+2)}$.

DISCLOSURE OF INVENTION

It is an object of the invention to provide a silicon nitride film for ULSI circuit fabrication that is stable on long term air exposure, that is stable to high temperature annealing and that has very good conformality.

It is a further object to provide a silicon nitride deposition process that can be easily and reproducibly modulated to incorporate variable ratios of fluorine and hydrogen in a predictable fashion.

It is a further object to provide a process that is compatible with structures and compositions that are commonly part of ULSI devices.

It is a further object to provide semiconductor devices that utilize a fluorinated nitride dielectric film of 5 to 50 nm thickness.

The invention relates to a process for producing a fluorinated silicon nitride film on a substrate comprising introducing into a film forming chamber a mixture of a silane, a perfluorosilane and nitrogen and applying electromagnetic radiation to the mixture to produce a plasma whereby a deposition film is formed on a substrate. The silane and perfluorosilane in the mixture are in a ratio of about 0.05 to about 3 on a volume basis, preferably 0.05 to 1, more preferably about 0.2 to about 0.6, most preferably about 0.5. The preferred silanes are $SiH_4$, $Si_2H_6$ and $Si_3H_8$; the preferred perfluorosilanes are $SiF_4$, $Si_2F_6$ and $Si_3F_8$. The most preferred silane is $SiH_4$ and the most preferred perfluorosilane is $SiF_4$.

Considerable variation is allowed in other conventional CVD process variables. The electromagnetic radiation can be of any frequency from low radio frequencies to microwaves; radio frequencies are preferred, in particular frequencies of 400 Khz to 100 Mkhz, more preferably 10 to 50 Mhz, most preferably about 13–14 Mhz. The power density of the radiation source is preferably from about 0.6 to about 5.5 watt/cm², more preferably about 1–2 watt/cm². It is preferred that the film forming chamber be maintained at about 2 to about 10 torr and about 300° to about 600° C., more preferably about 4 to about 6 torr and about 400° to about 450° C. The preferred embodiment comprises a mixture of 20 parts of silicon tetrafluoride, from 1 to 20 parts silane, and from 100 to 10,000 parts nitrogen. In a preferred process the silicon tetrafluoride is introduced into the chamber at a rate of about 10 to about 70 standard cubic centimeters per minute (sccm). In a more preferred embodiment the silicon tetrafluoride is introduced into the chamber at a rate of about 20 sccm, nitrogen at a rate of about 5,000 sccm and silane at a rate of about 4–10 sccm. A preferred ratio of the combination of silane and perfluorosilane to nitrogen is about 0.005 to about 0.025 by volume.

In another aspect, the invention relates to films produced by the inventive process, and, in particular, to a highly conformal fluorinated silicon nitride film containing from about 15 to about 20 atom % fluorine, and having a dielectric constant between 6.0 and 6.7, a refractive index from 1.64 to 1.80, and a surface state density of from $6\times10^{11}$ to $8\times10^{11}$ charges/cm². The film may be further characterized in that it contains less than 1 atom % of oxygen. The film does not exhibit breakdown below 7 MV/cm; it absorbs less than 2% by weight of water after immersion for 20 minutes in water at 100° C.; and it exhibits less than 1% change in thickness after annealing at 850° C. for 30 minutes.

In another aspect the invention relates to a semiconductor device comprising a substrate and a fluorinated silicon nitride film as described above. In a preferred embodiment the silicon nitride film is from 5 to 50 nm in thickness.

Because the structure of the film is difficult to specify with precision, the invention may also be described as a product described as a product-by-process. In this aspect the invention relates to a fluorinated silicon nitride film produced by the process of introducing into a film-forming chamber at 4 to 6 torr and 400° to 450° C. a flow of silane, tetrafluorosilane and nitrogen at a rate of 4 to 10 sccm silane: 20 sccm tetrafluorosilane: 5000 sccm nitrogen, and applying electromagnetic radiation in the range from 400 Khz to 100 Mhz and a power density of 0.6 to 5.5 watt/cm² whereby a highly conformal fluorinated silicon nitride film is formed. This film may be further characterized in that it contains from about 15 to about 20 atom % of fluorine and has a dielectric constant between 6.0 and 6.7 and a refractive index from 1.64 to 1.80.

Semiconductor devices may be fabricated incorporating fluorinated silicon nitride films as described above by technology well known in the art.

BRIEF DESCRIPTION OF THE DRAWINGS

The foregoing and other objects, features and advantages of the invention will be apparent from the following more particular description of preferred embodiments of the invention, as illustrated in the accompanying drawings.

FIG. 2 is of a silicon nitride layer deposited from a reaction gas mixture of silane and silicon tetrafluoride having a ratio of 0.25, FIG. 3 is of a silicon nitride film deposited from a reaction gas mixture having a ratio of 0.5, and FIG. 4 is from a ratio of 1.

BEST MODE FOR CARRYING OUT THE INVENTION

Figure 1:
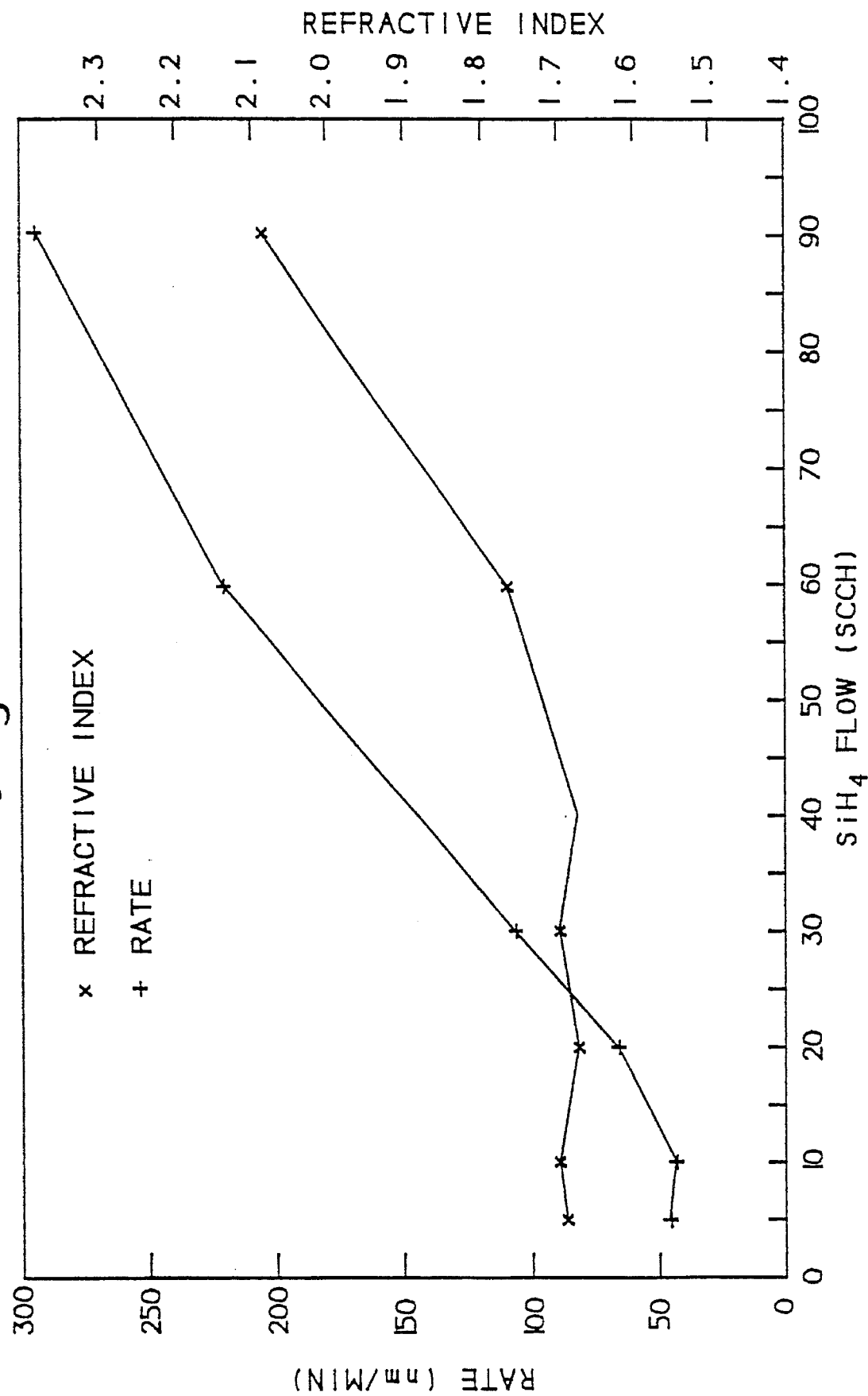
FIG. 1 is a plot of deposition rate and refractive index as a function of silane flow at 20 sccm of $SiF_4$.

The improved low temperature silicon nitride film PECVD process of this invention comprises introducing a mixture of a silane, a perfluorosilane, and nitrogen into a film forming chamber and applying electromagnetic radiation to the mixture of gases to produce a plasma, as a result of which a fluorinated silicon nitride layer is deposited on the substrate. A critical feature of the inventive process is the particular mixture of source gases for the fluorinated silicon nitride and their volume-to-volume (v/v) ratio.

One source of the silicon is a silane, which may preferably be $SiH_4$, $Si_2H_6$ or $Si_3H_8$, most preferably $SiH_4$. A second source of silicon and a source of fluorine is a perfluorosilane, which may preferably be $SiF_4$, $Si_2F_6$, or $Si_3F_8$, most preferably $SiF_4$. $Si_3H_8$, $Si_3F_8$ and higher molecular weight silicon compounds are liquids at STP. They are, however, gases at the 300°–600° C. operating temperature of the process, and the term gas in this context thus includes aerosols and vapors produced from the interaction of the discharge with the liquids. The ratio of silane to perfluorosilane determines the characteristics of the film that is deposited. In the text that follows ratios are on a v/v basis unless otherwise indicated. When the ratio of silane to perfluorosilane is about 0.05 to about 1, stable and uniform silicon nitride films are deposited. Films deposited when the ratio is greater than 1 and up to about 3 can be made and may be suitable for some applications, however when the ratio is above 3 they are generally unstable and react easily with water vapor upon exposure to air to form ammonium silicon hexafluoride. Mixtures having a ratio from about 0.2 to about 0.6 are particularly well suited for fabricating fluorinated silicon nitride films for ULSI devices because these films show less than 2% thickness reduction after annealing in nitrogen for 30 minutes at 900° C., they are very stable in air, and they have very high conformality as discussed below.

The source of nitrogen for the silicon nitride is molecular nitrogen, which functions both as a reactant and as a carrier gas in the process of the invention. Because it is acting as a carrier gas, nitrogen is always present in great excess and commonly will represent from 100 to 10,000 parts per 20 parts of silicon tetrafluoride.

The film forming chamber used in the present experiments was an AME 5000 (available from Applied Materials, Inc., Santa Clara, Calif.) but the chamber is not critical, and other suitable chambers are commercially available and their operation is well known in the art. In the operation of a film forming chamber, the applied voltage, frequency, system pressure, and gas flow rates are all interdependent, but may be varied over a wide range consistent with the basic requirement of establishing the plasma. Thus, for a higher pressure the voltage and/or frequency will have to be raised. Conversely, for lower pressures the voltage and frequency may be reduced. For the purpose of depositing 30 to 100 nm films of fluorinated silicon nitride with high precision and uniformity, the optimal radio frequency is from 10 to 50 Mhz. However, any electromagnetic radiation that is capable of producing a plasma will function in the inventive process, and radio frequencies from 400 Khz to 100 Mhz are particularly suitable. A 13 to 14 Mhz frequency was used for convenience. The power density can be from about 0.6 to 5.5 watts/cm$^2$; 1 to 2 is optimal. The temperature of the chamber is maintained at 300° to 600° C., preferably about 400° to 450° C., and the pressure is maintained at 2 to 10 torr preferably 4 to 6 torr.

In the case where 30 to 100 nm films of fluorinated silicon nitride are being deposited for ULSI circuits it is desirable to keep the rate of deposition at 30 to 150 nm per minute. However, for other applications it may be desirable to increase the flow rate of the silane and perfluorosilane gases so that a deposition rate of up to 300 nm per minute can be obtained. The nature of the film is determined by the ratio of the silane to perfluorosilane; modifying the flow rate of the mixture of gases will primarily modulate the rate of deposition and not the nature of the film. For 30 to 100 nm films, a flow rate of from 10 to 70 standard cubic centimeters per minute (sccm) for the silicon tetrafluoride has been found particularly suitable. The rate of introduction of silane is then adjusted to provide the proper proportion in relation to the flow rate of the silicon tetrafluoride. A flow rate of 5000 sccm of nitrogen has been found to give good uniformity film deposition at 5 to 40 sccm of silane and silicon tetrafluoride.

The substrate may be any material on which a silicon nitride film is desired; for example, silicon wafers, plastic resin, glass or metal objects or films, gallium arsenide layers or any semi-conductor layer or device.

In a representative example of the process of the invention, stable fluorinated silicon nitride films were deposited on a p-type silicon substrate using a chemical vapor deposition process on a single wafer system in an AME 5000 chamber. Ultra high purity silicon tetrafluoride, silane, and nitrogen were used as reactant gases. The silicon tetrafluoride was provided at 20 sccm, the silane at 10 sccm, and the nitrogen at 5000 sccm. The power density was 1.45 watts per square centimeter, the temperature was 400° C., the pressure was 5 torr and the electrode spacing was 0.8 to 1.2 centimeters. Under these conditions the film deposition rate was 48 to 60 nm per minute.

The bonding and composition of fluorinated silicon nitride films were analyzed by Fourier transform infrared (FTIR), X-ray photoelectron spectroscopy (XPS) and, for hydrogen, nuclear reaction analysis. MOS (Al/nitride/p-Si substrate) electrical measurements were used to study the electrical characteristics of 40 nm fluorinated nitride films. The stability of fluorinated silicon nitride as deposited and after annealing at 700° to 900° C. in nitrogen for 30 minutes was examined. The step coverage conformality of the films was examined over a silicon trench structure and over 500 nm aluminum metal lines. Ellipsometic measurements of refractive index were also obtained. In general, an increase in refractive index reflects an increase in silicon content and conversely a decrease in refractive index indicates an increase in nitrogen content.

FIG. 1 shows a typical variation of fluorinated silicon nitride deposition rate and refractive index as a function of silane flow when silicon tetrafluoride is held constant at 20 sccm under center line deposition conditions (5000 sccm $N_2$, 5 torr, 440° C., 1.4 watts/cm$^2$). The refractive index, i.e. the composition of the fluorinated silicon nitride film, remains relatively constant as the ratio is increased from 0.05 to 1; above the ratio of 1, the refractive index begins to increase. The refractive index, as well as the film uniformity and the deposition rates were studied as a function of pressure, power of the electromagnetic radiation and the silane to silicon tetrafluoride flow ratio. Deposition rate and uniformity generally increase with increasing RF power and with decreasing silane to silicon tetrafluoride flow ratio. Increased pressure tends to reduce the deposition rate and the uniformity.

Film uniformity of fluorinated silicon nitride deposited as described in the example above is excellent; there is less than 3.5% variation in film thickness within a range of three standard deviations.

FTIR spectra of stable fluorinated silicon nitride films show the presence of silicon-nitrogen and silicon-fluorine bonds at 920 to 960 cm$^{-1}$; nitrogen-hydrogen bonds are also evident at 1180 and 3350 cm$^{-1}$; there is no detectable silicon-hydrogen bond stretching in the region around 2200 cm$^{-1}$.

Figure 2:
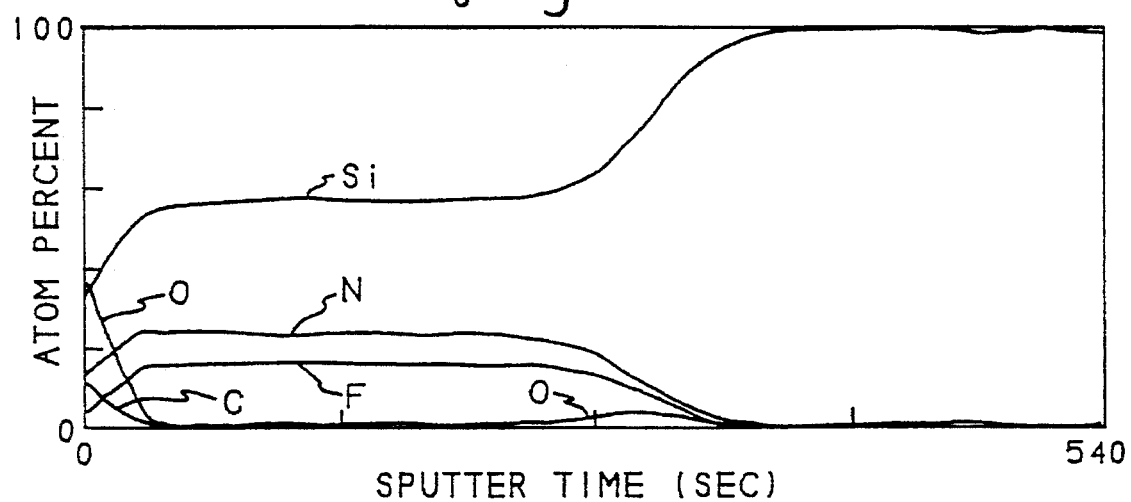
FIGS. 2, 3, and 4 are X-ray photoelectron spectroscopic depth profiles of films of the invention.
Figure 3:
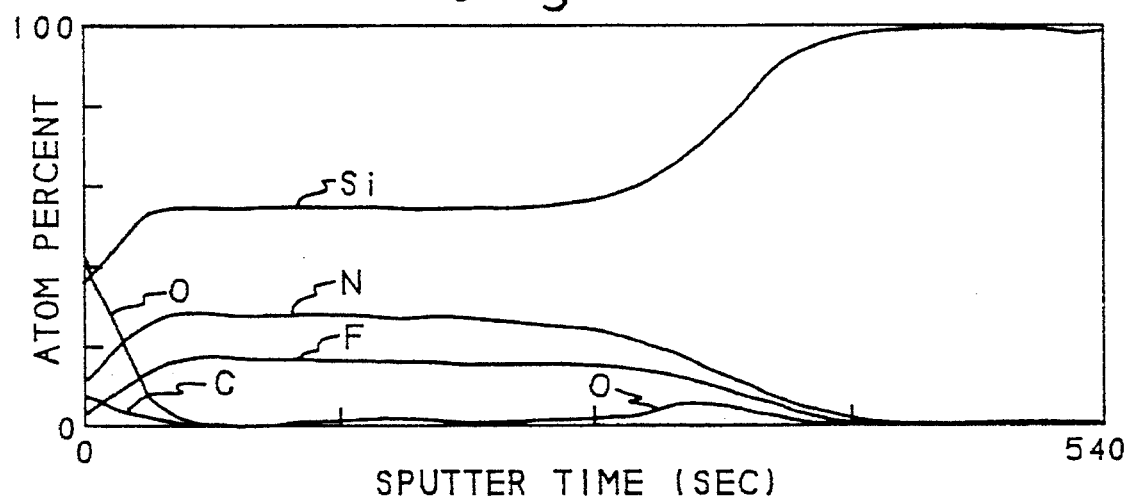
Figure 4:
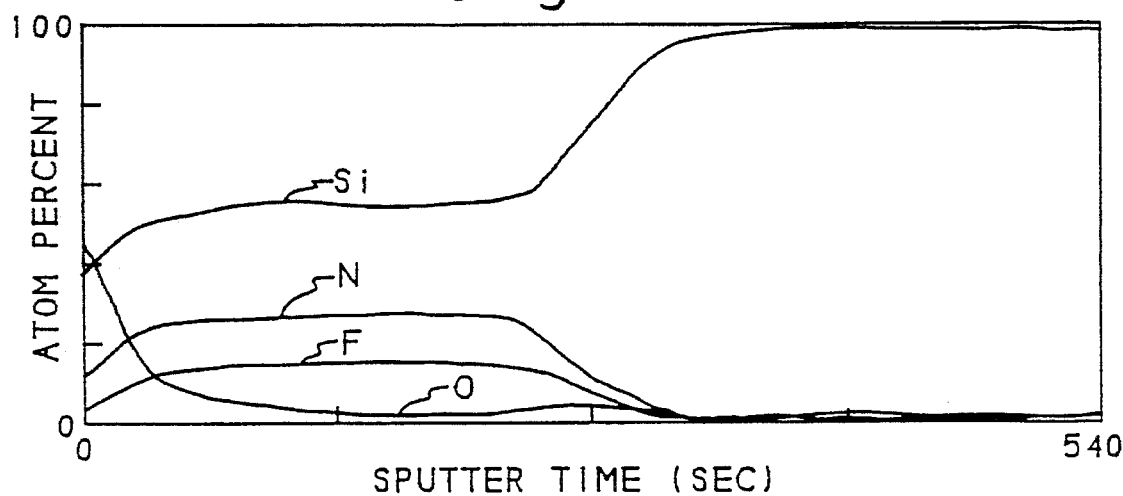

FIGS. 2, 3, and 4 are graphs derived from XPS showing atom percent of each element in the film as a function of depth into the film. The y-axis represents from 0 to 100 atom percent of the element in question; the x-axis represents sputtering time from 0 to 540 seconds. Thus, the left edge of the graph may be considered the surface of the silicon nitride layer and the region in which the silicon curve begins to climb toward 100 atom percent from about 60 atom percent may be thought of as the interface between the silicon nitride layer and the silicon substrate. FIG. 2 is the film deposited at a $SiH_4/SiF_4$ ratio of 0.25; FIG. 3 is at a ratio of 0.5 and FIG. 4 is at a ratio of 1.0. It will be noted that oxygen has intruded only marginally into the surface when the ratio is below 0.5. These curves are substantially unchanged after six to twelve months' exposure to ambient air, indicating the remarkable chemical stability of the films in which the ratio is below 0.5. The XPS depth profiles shown in FIGS. 2 and 3 indicate that these films are silicon rich, contain up to 17% fluorine, and are oxidized only shallowly by post-deposition surface oxidation. The hydrogen content of the films, which is obtained from nuclear reaction analysis, is 5 to 6 atom percent in films generated from mixtures where the ratio of silane to silicon tetrafluoride is below 0.5. The hydrogen content increases to 14 atom percent and the fluorine concentration decreases correspondingly as the ratio increases above 0.5. Preferred films contain from 15 to 20 atom percent of fluorine and less than 1 atom percent oxygen.

Figure 5:
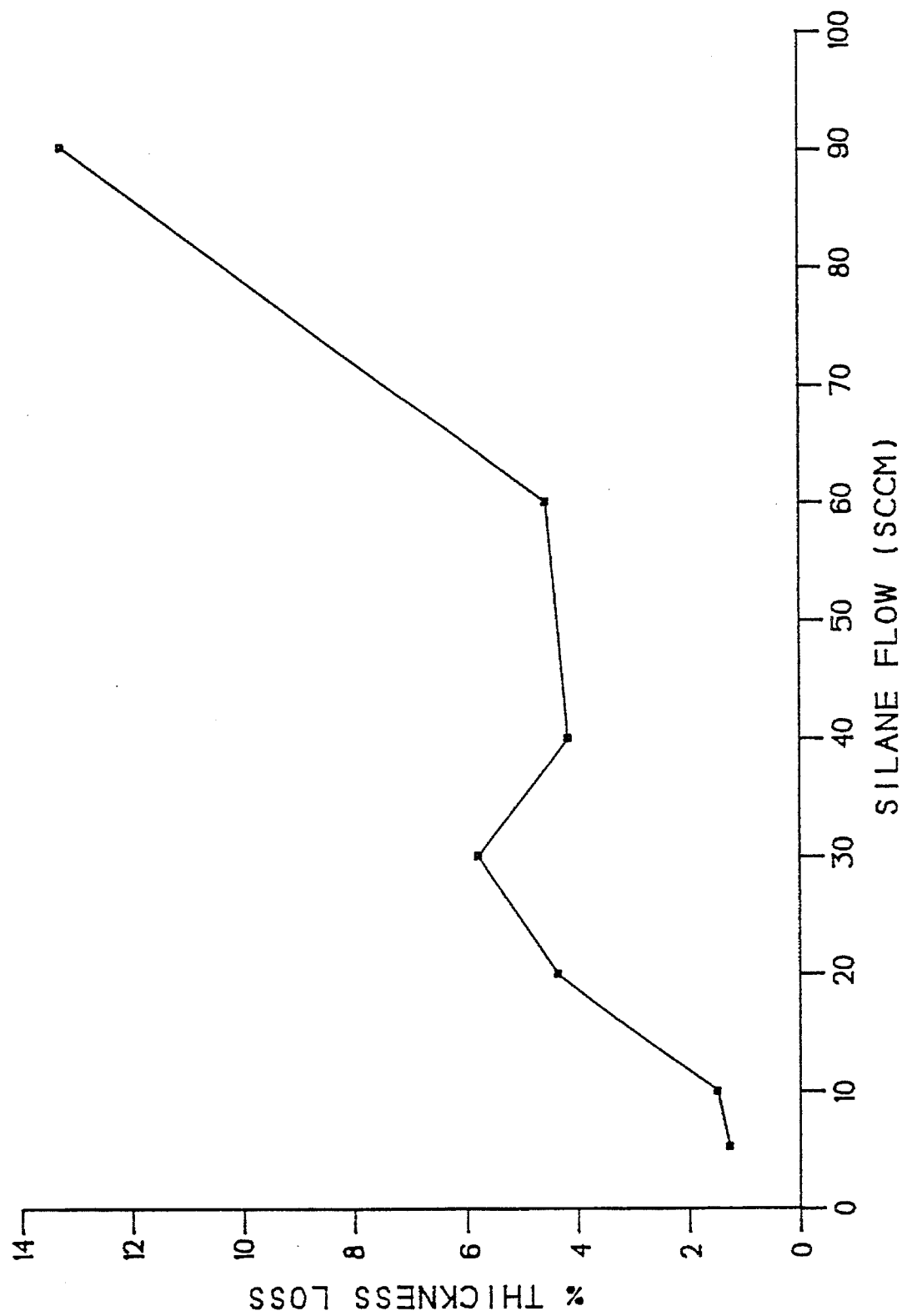
FIG. 5 is a plot of percent thickness loss in annealing versus silane flow rate at 20 sccm of $SiF_4$.

The stable fluorinated silicon nitride films show less than 2% thickness reduction after annealing in nitrogen at 900° for 30 minutes. This compares to a typical thickness reduction of 12% to 15% for conventional plasma silicon nitride films after the same annealing. FIG. 5 shows the percent of film thickness that is lost upon annealing as a function of silane flow (i.e. $SiH_4/SiF_4$ ratio) in a deposition process carried out at 20 sccm $SiF_4$, 5000 sccm $N_2$ and other parameters as before. The stability of films with ratio below 3 is quite good and below 0.5 is outstanding. Preferred films show less than 1% thickness change after annealing at 850° C. for 30 minutes in hydrogen, nitrogen, or nitrogen-oxygen mixtures.

MOS electrical measurements of 36 to 40 nm films show good breakdown characteristics (7 to 8 MV/cm), stable flat band voltage shifts with good distribution (−1.98 to −2.07 V) and significant surface interface trap charge ($Qss=6\times8\times10^{11}$ charge/cm$^2$). Stable fluorinated nitride films have dielectric constants between 6 and 6.7 and breakdown voltages of 7 to 8 MV/cm. The films of the invention also show very high conformality—greater than 80%—over silicon trench structures having a 3 to 1 aspect ratio. Although the fluorinated silicon nitride films show excellent conformality on silicon trenches, the conformality on 500 nm aluminum line structures is less than 50%. This may be due to the initial formation of aluminum fluoride on the aluminum surface.

The films prepared within the preferred parameters described above and with silane flow of 4 to 10 sccm are extremely stable, showing no measurable (i.e. less than 2%) water absorption after immersing in boiling water for 20 minutes.

Stress measurements of 1 μm films show that all fluorinated nitride films have tensile stress in the range of 1.5–2.0×10$^9$ dyne/cm$^2$.

While the invention has been particularly shown and described with reference to preferred embodiments thereof, it will be understood by those skilled in the art that other changes in form and details may be made therein without departing from the spirit and scope of the invention.

We claim:

1. A highly conformal stable fluorinated silicon nitride film containing from about 15 to about 20 atom % fluorine, and having a dielectric constant between 6.0 and 6.7, a refractive index from 1.64 to 1.80, a surface state density of from $6\times10^{11}$ to $8\times10^{11}$ charges/cm$^2$ and containing less than 1 atom % of oxygen.

2. A film according to claim 1 further characterized in that said film does not exhibit breakdown below 7 MV/cm.

3. A film according to claim 1 further characterized in that said film absorbs less than 2% by weight of water after immersion for 20 minutes in water at 100° C.

4. A film according to claim 1 further characterized in that said film exhibits less than 1% change in thickness after annealing at 850° C. for 30 minutes.

5. A fluorinated silicon nitride film produced by the process of introducing into a film-forming chamber at 4 to 6 torr and 400° to 450° C. a flow of silane, tetrafluorosilane and nitrogen at a rate of 4 to 10 sccm silane: 20 sccm tetrafluorosilane: 5000 sccm nitrogen, and applying electromagnetic radiation in the range from 400 Khz to 100 Mhz and a power density of 0.6 to 5.5 watt/cm$^2$ whereby a highly conformal fluorinated silicon nitride film is formed.

6. A fluorinated silicon nitride film according to claim 5 characterized in that said film contains from about 15 to about 20 atom % of fluorine and has a dielectric constant between 6.0 and 6.7 and a refractive index from 1.64 to 1.80.

* * * * *

UNITED STATES PATENT AND TRADEMARK OFFICE
CERTIFICATE OF CORRECTION

PATENT NO. : 5,462,812
DATED : October 31, 1995
INVENTOR(S) : Nguyen, et. al.

It is certified that error appears in the above-indentified patent and that said Letters Patent is hereby corrected as shown below:

Title page, item [73], Assignee: should read--International Business Machines Corporation, Armonk, N.Y.--

Column 7, line 43, delete --($Qss=6x8x10^{11}$-- and insert therefor --($Qss=6-8x10^{11}$--.

Signed and Sealed this

Twelfth Day of March, 1996

*Attest:*

BRUCE LEHMAN

*Attesting Officer*   *Commissioner of Patents and Trademarks*